United States Patent [19]

Movchan et al.

[11] Patent Number: 5,296,274
[45] Date of Patent: Mar. 22, 1994

[54] METHOD OF PRODUCING CARBON-CONTAINING MATERIALS BY ELECTRON BEAM VACUUM EVAPORATION OF GRAPHITE AND SUBSEQUENT CONDENSATION

[76] Inventors: Boris A. Movchan, ulitsa Darvina, 7, kv.7.; Nikolai I. Grechanjuk, bulvar Davydova, 7, kv.29.; Jury B. Chuikov, ulitsa Tsitadelnaya, 4/7, kv.18.; Boris E. Paton, ulitsa Chkalova, 41a, kv.26.; Vladimir V. Stetsenko, ulitsa Malinovskogo, 11,kv.10., all of Kiev, U.S.S.R.

[21] Appl. No.: 700,201
[22] PCT Filed: May 10, 1989
[86] PCT No.: PCT/SU89/00119
   § 371 Date: Nov. 8, 1991
   § 102(e) Date: Nov. 8, 1991
[87] PCT Pub. No.: WO90/13683
   PCT Pub. Date: Nov. 15, 1990
[51] Int. Cl.⁵ ............................................. B05D 1/00
[52] U.S. Cl. .................... 427/566; 427/577; 427/580; 427/586; 427/596; 427/122; 427/249; 427/294
[58] Field of Search ............... 427/122, 566, 577, 580, 427/586, 596, 122, 249, 294; 429/408, 794; 204/192.38

[56] References Cited

U.S. PATENT DOCUMENTS

| | | | |
|---|---|---|---|
| 2,583,671 | 7/1954 | Findlay et al. | 427/249 |
| 3,347,701 | 10/1967 | Yamagishi et al. | 427/596 |
| 3,470,978 | 1/1969 | Adams | 427/566 |
| 4,762,975 | 8/1988 | Mahoney et al. | 427/596 |
| 4,877,677 | 10/1989 | Hirochi et al. | 427/122 |
| 4,919,968 | 4/1990 | Buhl et al. | 204/192.38 |

Primary Examiner—Shrive Beck
Assistant Examiner—Benjamin L. Urech
Attorney, Agent, or Firm—Keck, Mahin & Cate

[57] ABSTRACT

A method of producing carbon-containing materials, residing in that, prior to electron-beam vacuum evaporation of graphite, on the surface of the graphite there is disposed a transition metal of Groups VI-VIII of the Periodic System or a mixture of at least two transition metals of said Groups, ensuring a higher rate of evaporation of graphite with respect to said metals or mixture, the metal or mixture is melted by an electron beam (10), evaporation of the graphite proceeding through the resulting melt (11) with subsequent condensation of the graphite on a support (4). In the course of gradual consumption of the graphite and said metal or mixture their supply into the resulting melt (11) is effected in such a manner that the consumed surface of the graphite should be completely overlapped by the melt (11).

6 Claims, 6 Drawing Sheets

METHOD OF PRODUCING CARBON-CONTAINING MATERIALS BY ELECTRON BEAM VACUUM EVAPORATION OF GRAPHITE AND SUBSEQUENT CONDENSATION

FIELD OF THE ART

The present invention relates to the methods of producing materials and coatings in a vacuum and more particularly to a method of producing carbon-containing materials.

PRIOR ART

At present there exists a problem of producing carbon-containing materials and coatings with a high efficiency within a wide range of condensation temperatures, including low ones. The latter circumstance provides a possibility of extending the range of materials and supports, of varying the structure and properties of the materials and coatings produced within broad limits and, in the case of an ionic component being present in the vapour flow of carbon, of producing coatings and materials comprising metastable phases of carbon: diamond and carbin.

Known in the art is a method of depositing carbon coatings from a gas phase as a result of pyrolysis of carbon-containing substances, mainly hydrocarbons, on a hot surface (E. F. Chalykh, "Tekhnologiya Uglegraphitovykh Materialov"/'Tecgnology of Carbon-Graphite Materials'/, 1963, Metallurgizdat (Moscow), pp. 266-267). In this case the carbon deposition rate depends or the rate of the reaction of pyrolysis, as well as on the concentration of the gaseous mixture, on the rate of its feed to the reaction zone, and on the temperature of the surface being coated. Under optimal process conditions the rate of carbon depositing is high and may reach 1000 $\mu$m/h. However, the limiting factor in the process is the temperature of the support, this being decisive for the lower limit of this parameter, amounting to 900° C. The latter circumstance limits both the range of materials to which it is possible or at least expedient to apply a coating and the possibilities of varying the structures of the condensate. Lowering of the support temperature or increasing of the concentration of hydrocarbons in the reaction zone (for increasing the rate of the process) leads to the formation of loose sooty deposits and to an increase of hydrogen content in the carbon layer, whereby the quality of the coating is impaired appreciably.

Methods are known in the art, which make it possibly to apply a dense carbon coating practically at any temperature of the support. In these methods the technology of physical deposition from the vapour phase (PVD) is employed.

For example, a method of producing carbon coatings is known in the art (V. E. Strelnitsky, V. G. Padalka, S. I. Vakula, "Nekotorye svoistva almazopodobnykh uglerodnykh plenok, poluchennykh pri kondensatsii plamennogo potoka v usloviyah ispol'zovaniya vysokochastotnogo potentsiala"/'Some Properties of Diamond-Like Carbon Films Produced in Condensation of Plasma Flow Under the Conditions of Using High-Frequency Potential'/—Zhurnal Tekhnicheskoi Fiziki, 1978, vol. 48, Issue 2, pp. 377-381), which pertains to the PVD technology. In the given method the source of carbon vapours is a self-sustaining arc discharge, developing in the vapours of an eroding graphite cathode. The method makes it possible to produce coatings within a wide range of support temperatures, including water-cooled supports; this, in combination with an ionic component in the vapour flow, enables the production of coatings comprising metastable phases of carbon (diamond, carbin). The rate of applying the coating is up to 10 $\mu$m/h. Nevertheless, a specific feature of the process is the inevitable presence of graphite fragments in the carbon vapours. This circumstance is brought about by specific features of the erosion of the cold graphite cathode in the cathode microscopic spots of the vacuum arc, in which the current density reaches $10^5$ to $10^6$ A/cm$^2$. The surface of the graphite cathode is in the solid state, the convective heat transfer is thus absent, and this fact contributes to local overheating of microscopic areas of the cathode surface and to the origination of microscopic spots. Said circumstance in combination with the specific features of the graphite structure (laminated structure with weak bonds between the layers) leads to ejection of graphite fragments into the vapour flow.

Also known is a method of applying carbides of transition metals by evaporation and condensation in a vacuum with the use of heating of the evaporated surface by means of an electron beam (JP, B 54-4473). Evaporation is carried out from two independent evaporators, one of them containing a transition metal and the other containing carbon in the form of graphite. Vapour flows of both components are directed to a common support preheated to a prescribed temperature; as a result, a carbide is formed thereon. The ratio of the components in the coating may be adjusted by varying the ratio of the amounts of heating power used for heating the materials being evaporated, found in different heaters. Due to a more uniform heating of the surface of graphite by the electron beam, the method makes it possible to increase somewhat the rate of carbon evaporation without ejection of graphite fragments into the vapour plase and to apply quality coatings at a rate of up to 15 $\mu$m/h.

Nevertheless, said rate of applying carbon-containing coatings, in the given case, carbide coatings, is appreciably lower than the rate attainable in the application of coatings from the majority of other materials, including transition metals, by means of electron beam evaporation and condensation and amounting to 900-1200 $\mu$m/h (B. A. Movchan, I. S. Malashenko; "Zharostoikie Pokrytiya, Osazhdaemye v Vakuume"/'Vacuum-Deposited Heat-Resistant Coatings'/, Naukova Dumka (Kiev), 1983, pp. 30-31). This is conditioned by the fact that the rate of carbon evaporation is a restraining parameter of the process of producing both single-component and multicomponent coatings on the basis of carbon in the case of electron-beam evaporation and condensation. The low value of the specific rate of evaporation (the mass of substance, evaporated from unit area per unit of time) of carbon, employed in the technological processes, is due to a sharp increase of the quantity of graphite fragments in the vapour phase, when the specific power of heating the surface of graphite by the electron beam exceeds a definite critical value, which leads to the formation of defects and discontinuities in the coating, i.e. to the deterioration of its quality. Laboratory tests showed that an intensive ejection of graphite fragments is observed when the specific power of heating the surface of graphite reaches 4-5 MW/m$^2$. Such a character of graphite evaporation is associated with that graphite evaporates from the solid state, that is, by way of sublimation, and the evaporation process is substantially influenced by the specific features of graphite structure, in particular, by its laminate structure and weak binding between the layers. The binding forces between the atoms in one layer have a considerable value: 710 kJ/mole, whereas the binding forces between the atoms of different layers are extremely small: 4.2 to 18.2 kJ/mole (V. S. Ostrovsky et al., "Iskusstvennyi Grafit"/'Synthetic Graphite'/, 1986, Metallurgiya (Moscow), pp. 12-13). These are weak Van der Waals forces, which are characterized not by the chemical, but by weak physical interactions. The weak binding between the layers in the whole increases the probability of fragmentation of the graphite crystals and of the ejection of the fragments into the vapor phase. This circumstance makes the process of graphite evaporation different from the evaporation of the majority of other materials.

Thus, attempts to increase the density of the vapour flux of carbon by intensifying the process of evaporation will inevitably lead to deterioration of the quality of coating.

DISCLOSURE OF THE INVENTION

The invention is directed to the provision of such a method of producing carbon-containing materials, in which, due to modification of the conditions of carbon evaporation, a possibility is ensured for a considerable increase of the specific rate of carbon evaporation without the ejection of graphite fragments into the vapour phase, and, as a consequence, there appears a possibility of increasing the efficiency of the process of producing carbon-containing materials and coatings within a wide range of temperatures of the support, while in the ionization of the vapourous flux there appears a possibility of producing carbon-based materials and coatings with a high efficiency, said materials and coatings containing metastable phases of carbon; diamond and carbon, and in the case of producing multicomponent coatings there arises a possibility of reducing the temperature of the support, required for the synthesis of the required structure of the material or coating and broadening of the list of the support materials.

Said object is accomplished due to the fact that in a method of producing carbon-containing materials, comprising electron-beam evaporation of carbon in vacuum with subsequent condensation of said carbon on a support, according to the invention, before the electron-beam evaporation on the graphite surface there is disposed a transition metal of Group VI-VIII of the Periodic System or a mixture of at least two transition metals of said Groups, ensuring a higher rate of evaporation of carbon with respect to said metal or mixture of metals, said metals or mixture are melted by an electron beam, in this case there occurring evaporation of graphite through the resulting melt and condensation of the graphite on the support, in the course of consumption of the graphite and said metal or mixture their supply into the resulting melt being effected in such a manner as to provide complete overlapping of the consumed surface of the graphite with the melt.

It is expedient that as the transition metal of Groups VI-VIII of the Periodic System use should be made of tungsten or molybdenum and as the mixture of at least two transition metals of Groups VI-VIII of the Periodic System use should be made of a mixture of tungsten and molybdenum, for example, in the atomic ratio of 1:1.

Due to the fact that before the electron-beam evaporation of graphite said metal or mixture of metals is disposed on the surface of the graphite and melted by the electron beam, a melt is formed on the graphite surface, the presence of this melt precluding direct contact of the electron beam with the graphite surface and ensuring dissolution of the graphite with the formation of a carbon-containing melt.

Since the metallic components of the melt are selected so that a higher rate of carbon evaporation with respect to said metallic components should be ensured, the component which predominantly evaporates from the melt is carbon. The presence of fragments of graphite in the vapour phase is excluded in this case.

Furthermore, it is expedient to carry out additionally partial ionization of the vapour flux of the evaporated graphite in an arc discharge, the thermocathode of which is the resultant melt.

Due to the appearance of an ionic component in the vapour flux of carbon there appears a possibility of producing materials and coatings containing metastable phases: diamond and carbon. The expedience of using a melt disposed on the consumed surface of graphite as the thermocathode of the arc discharge stems from that as a result of convective intermixing the melt has a high and practically the same temperature throughout its volume, which, in combination with the high emission properties of the melt, contributes to the maintaining of a strong-current and uniformly distributed arc discharge without cathode microspots and to the obtaining of a dense uniform flux of highly ionized plasma without fragments of graphite.

It is also possible to supply a potential to the support, which is negative with respect to the plasma of the arc discharge or which is a high-frequency potential.

The presence of a potential on the support provides a possibility to impart a definite energy to the condensing ions, which, in turn, makes it possible to adjust the structure of the coating within a wide range, in particular, to increase the content of the metastable phases of carbon, i.e. of diamond and carbon, in the coating.

Furthermore, concurrently with the electron-beam evaporation of graphite, it is possible to carry out electron-beam evaporation of titanium or silicon and to effect combined condensation of all the components of the vaporous flux onto the common support.

In this way it is possible to produce multicomponent carbon-containing materials, for instance, carbides, in particular, titanium carbide. If it is necessary to lower the temperature required for the synthesis of the desired structure of the coating, it is possible to carry out partial ionization of the vaporous flux and, besides, to apply a potential to the support, which is negative with respect to the arc discharge plasma or a high-frequency one.

BRIEF DESCRIPTION OF THE DRAWINGS

The present invention will become more apparent from the description of its exemplary embodiments with reference to the accompanying drawings, in which.

THE BEST EMBODIMENTS OF THE INVENTION

Figure 1:
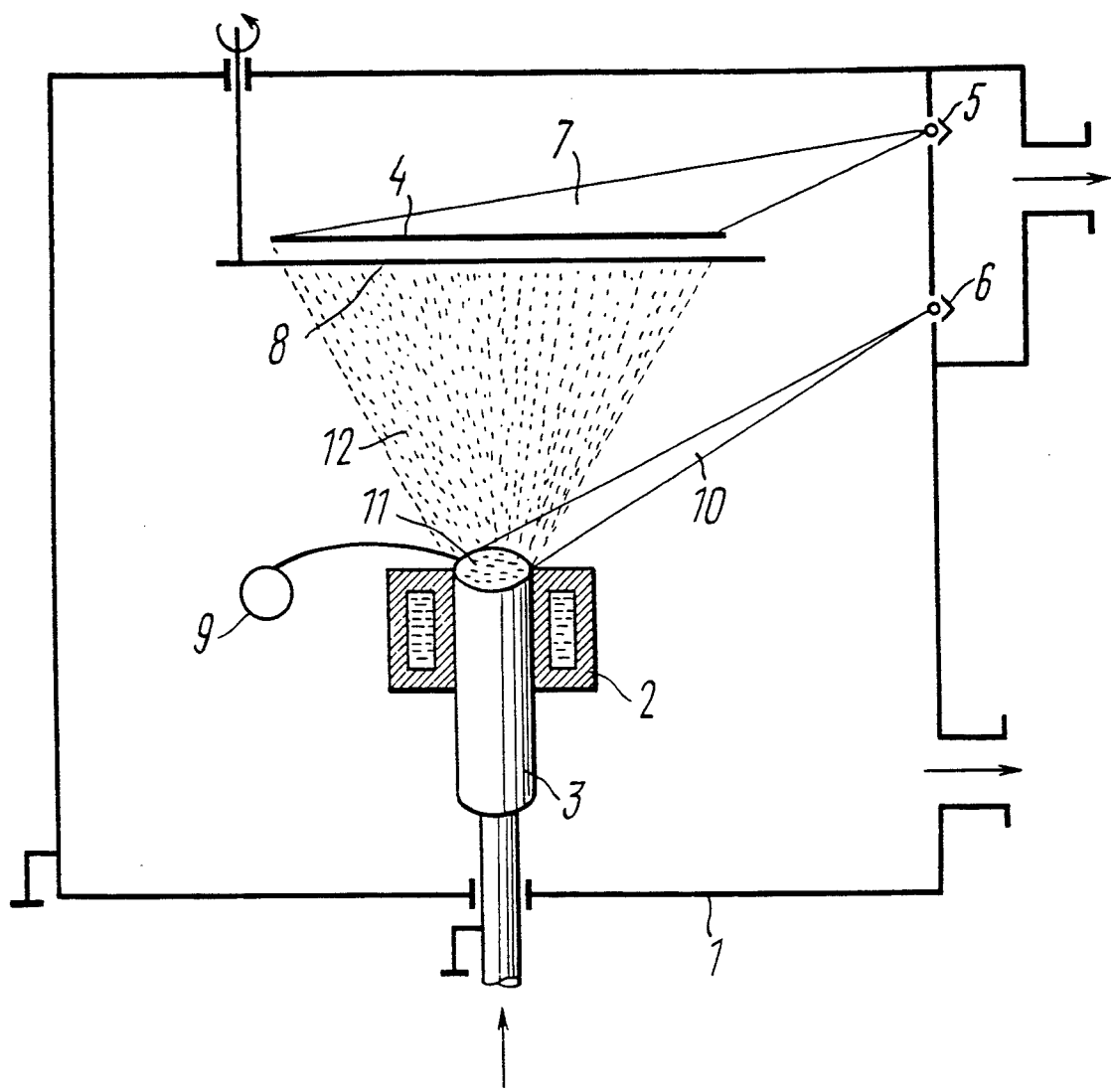
FIG. 1 shows diagrammatically an installation for electron-beam evaporation and condensation of materials.

The method of producing carbon-containing materials is realized on an installation for electron-beam evaporation and condensation of materials, in which, in the lower part of a vacuum chamber 1 (FIG. 1) a cylindrical water-cooled crucible 2 is disposed. In the crucible 2 a graphite rod 3 is arranged. On the surface of the graphite rod 3 there is disposed a transition metal of Groups VI-VIII of the Periodic System or a mixture of at least two transition metals of said Groups, ensuring a higher rate of the evaporation of carbon with respect to said metal or mixture. In the upper part of the chamber 1 a support 4 is disposed. In the side wall of the chamber 1 two electron guns 5 and 6 are arranged; one of them, the gun 6, when necessary, affects the surface of the support 4 with its electron beam 7. Into the space between the crucible 2 and the support 4 a damper 8 may be introduced. A replenishing device 9 is disposed near the crucible 2. All the elements in the chamber 1 and the chamber 1 itself are earthed; to the cathodes of the electron guns 5 and 6 a corresponding negative voltage is fed.

In such an installation the method of producing carbon-containing materials is carried out in the following manner. In the chamber 1 vacuum is created, the support 4 is either heated to a required temperature with the aid of the electron beam of the gun 5 or cooled, for example, with water. A transition metal or a mixture of transition metals, disposed on the surface of the graphite rod 3, is heated with an electron beam 10 of the gun 6 till a melt 11 is formed, evaporation of the rod 3 being thus effected. The presence of the melt 11 on the surface of the rod 3 ensures dispersion of the graphite particles that get into it, this leading to an increase of the concentration of carbon in the melt. Due to the fact that the metallic components of the melt are chosen so as to ensure predominant evaporation of carbon with respect to the metallic components, carbon predominantly evaporates from the melt, forming a vaporous flux 12. Then the damper 8 is opened, and the vaporous flux 12 begins to condense on the support 4, forming a coating. As the evaporation proceeds, the graphite rod 3 is moved upward, and the melt 11 is replenished from the replenishing device 9 with the metallic components of the melt.

Specific embodiments of the method will now be considered.

EXAMPLE 1

Into a cylindrical water-cooled crucible 2 (FIG. 1) with an internal diameter of 70 mm a graphite rod 3 having a diameter of 68.5 mm and a height of 200 mm were placed. 400 g of tungsten (W) were placed on the surface of the rod 3. A vacuum of $1.33-2.6 \cdot 10^{-2}$ Pa was created in a chamber 1. A support from silicon nitride ($Si_3N_4$) was heated by an electron beam 7 of a gun 5 to the temperature of 700° C. Tungsten disposed on the graphite rod 3 was heated by an electron beam 10 of a gun 6 till a melt 11 was formed, evaporation of the rod 3 being thus carried out. After melting of the tungsten, damper 8 was opened, and thus condensation of vaporous flux 12 onto support 4 and formation of a coating thereon were effected. As the evaporation proceeded, the melt 11 was replenished with tungsten wire having a diameter of 0.5 mm with the speed of 0.4 mm/s from a replenishing device 9. 30 min after the opening of the damper 8 it was closed, the power supply of the electric power supply of the guns 5 and 6 was cut off, and the process was thus terminated. The distance between the surface of the melt 11 and the support 4 was about 300 mm. The accelerating voltage of the electron guns was 20 kV. The beam current of the gun 6 was 3.5 A. The thickness of the resulting coating was 800–850 μm. The rate of coating application was 1600–1700 μm/h.

An x-ray structural analysis of the coating showed it to be an x-ray amorphous material with the short-range order corresponding to graphite.

EXAMPLE 2

The conditions of carrying the method into effect and the sequence of technological operations are similar to those described in Example 1, except that onto the surface of the graphite rod 3 (FIG. 1) not tungsten (W) but molybdenum (Mo) was placed in the quantity of 200 g. As the evaporation proceeded, the melt 11 was replenished with molybdenum wire of 0.5 mm in diameter with the rate of 0.6 mm/s. The beam current of the gun 6 was 2.0 A. The thickness of the coating produced was 200–230 μm. The rate of applying the coating was 400–460 μm/h.

An x-ray structural analysis of the coating showed it to be an x-ray amorphous material with the short-range order corresponding to graphite. The x-ray photographs also displayed lines corresponding to molybdenum.

EXAMPLE 3

The conditions of carrying the method into effect and the sequence of technological operations were similar to those described in Example 1, except that onto the surface of the graphite rod 3 (FIG. 1) not tungsten (W) but a mixture of tungsten (W) and molybdenum (Mo) was placed in an atomic ratio close to 1:1. The total mass of W and Mo was 300 g. As the evaporation proceeded, the melt 11 was replenished with tungsten wire of 0.5 mm in diameter with the rate of 0.2 mm/s and with molybdenum wire of 0.5 mm in diameter with the rate of 0.3 mm/s. The coating was deposited on copper water-cooled support 4, the temperature of the condensation surface of which in the course of applying the coating was varied within 160°–200° C. The beam current of the gun 6 was 2.5 A. The process duration since the moment of opening of the damper 8 was 10 min. The thickness of the resulting coating was 110–120 μm. The rate of applying the coating was 660–720 μm/h.

An x-ray structural analysis of the coating showed it to be an x-ray amorphous material with the short-range order corresponding to graphite. The x-ray photographs also displayed lines corresponding to molybdenum.

Figure 2:
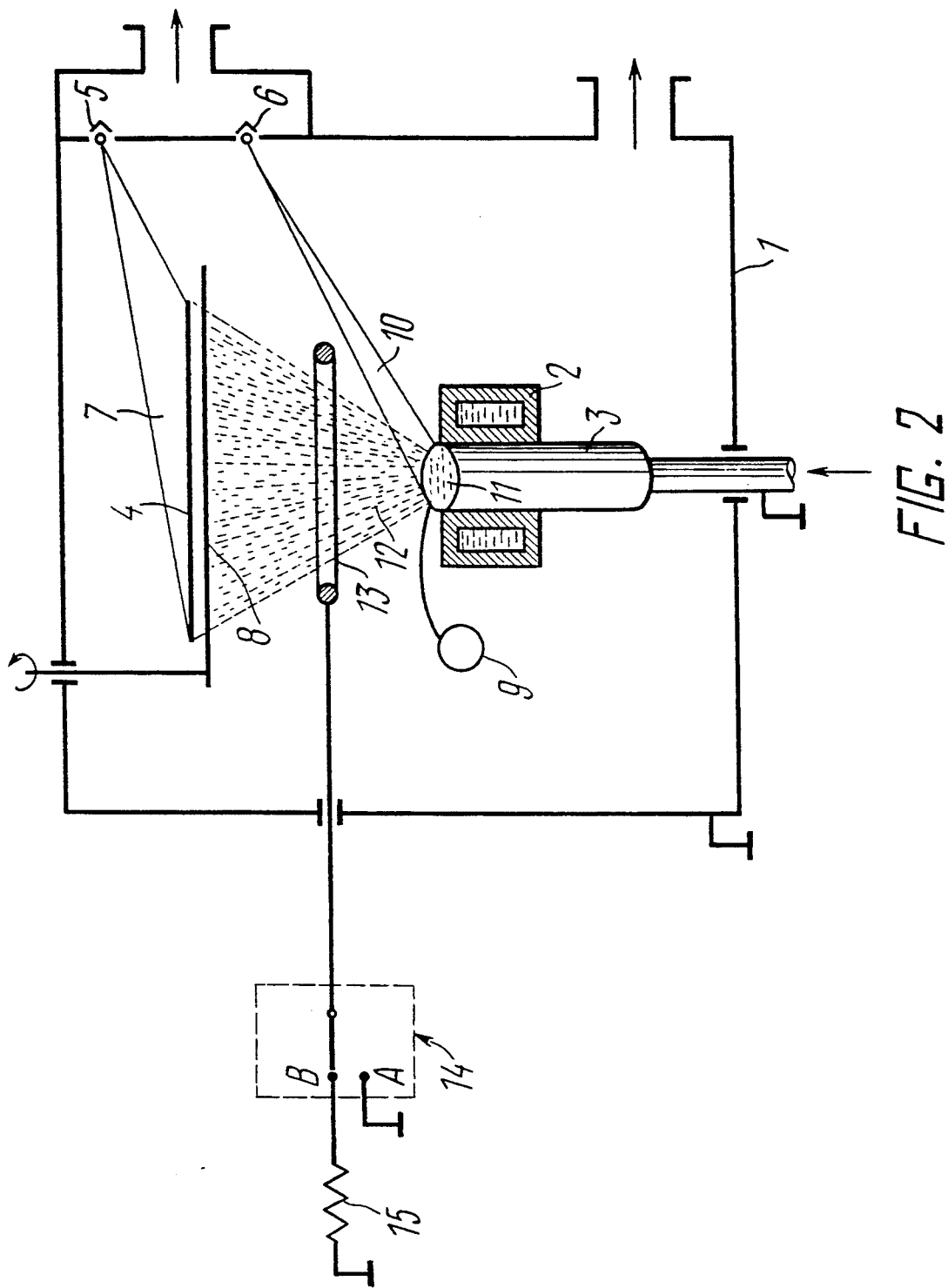
FIG. 2 shows diagrammatically an installation for electron-beam evaporation and condensation of materials with partial ionization of the vaporous flux.

An embodiment of the method of producing carbon-containing materials is possible, wherein, for producing materials and coatings containing metastable phases of carbon, viz., diamond and carbon, partial ionization of the vaporous flux in an arc discharge is carried out, the thermocathode of the arc discharge being the melt 11 disposed on the surface of the graphite rod 3. To do that, the installation for the electron-beam evaporation and condensation shown in FIG. 1 is additionally provided with an anode 13 (FIG. 2), disposed in the space between the damper 8 and the crucible 2. The anode 13 through a switch 14 may be connected to a direct current source 15 or grounded.

In such an installation the method for producing carbon-containing materials is effected in the following manner.

In the chamber 1 (FIG. 2) vacuum is created, the switch 14 is set to position "A", the support 4 is either heated by the electron beam 7 of the gun 5 to a required temperature or cooled, for instance, with water. A transition metal or a mixture of transition metals, disposed on the surface of the rod 3, is heated by the electron beam 10 of the gun 6 till the melt 11 is formed, evaporation of the rod 3 being thus performed. After that the switch 14 is brought over to position "B" and a positive potential is supplied to the anode 13 from the source 15. In the vaporous flux 12 of carbon there arises an arc discharge, its thermocathode being the melt 11. The thermocathode is in the liquid state, which contributes to levelling the temperature all over its surface; furthermore, the thermocathode has high emission characteristics, which fact provides a possibility to obtain a strong-current uniformly distributed arc discharge without cathode microspots. After that the damper 8 is opened and the partially ionized vaporous flux of carbon is condensed on the support 4, forming a coating thereon. Since the atoms or clusters of carbon in the arc discharge plasma acquire an additional energy which is released during the condensation, this gives an opportunity to vary the coating structure within a wide range, in particular, to obtain coatings, containing metastable phases of carbon.

A particular embodiment of the method will now be considered.

EXAMPLE 4

Into a cylindrical copper water-cooled crucible 2 (FIG. 2) with an internal diameter of 70 mm a graphite rod 3 was placed, having a diameter of 68.5 mm and a height of 200 mm. Onto the surface of the rod 3 350 g of tungsten (W) were placed. In a chamber 1 vacuum of $1.33-2.66 \cdot 10^{-2}$ Pa was created. A switch 14 was brought to position "A". The tungsten located on the rod 13 was heated by electron beam 10 of a gun 6 till melt 11 was formed, evaporation of the rod 3 being thus carried out. After that the switch 14 was brought over to position "B", a positive potential being thus fed to an anode 13. This led to an arc discharge being ignited in the vaporous flux 12 between the anode 13 and the melt 11. After that damper 8 was opened and the partially ionized vaporous flux 12 of carbon condensed onto copper water-cooled support 4, the temperature of the condensation surface of which in the process of coating application was 200°–230° C. The distance from the support 4 to the surface of the melt was 300 mm. The beam current of the electron gun 6 was 2.5 A. The accelerating voltage of the gun 6 was 20 kV. The arc discharge current was 280–300 A, the voltage drop across the arc was 35–40 V. The duration of the coating deposition process since the moment of opening of the damper 8 was 10 min. The melt 11 was replenished with tungsten wire of 0.5 mm in diameter with the rate of 0.4 mm/s. The thickness of the coating was 110–120 $\mu$m. The rate of coating application was 660–720 $\mu$m/h.

An x-ray structural analysis of the coating on the support 4 showed the coating to be an x-ray amorphous material. An analysis of the electronic state densities in the valence zone of the coating indicated the presence in said coating of up to 15 atomic % of metastable phases of carbon with predominance of carbon.

Figure 3:
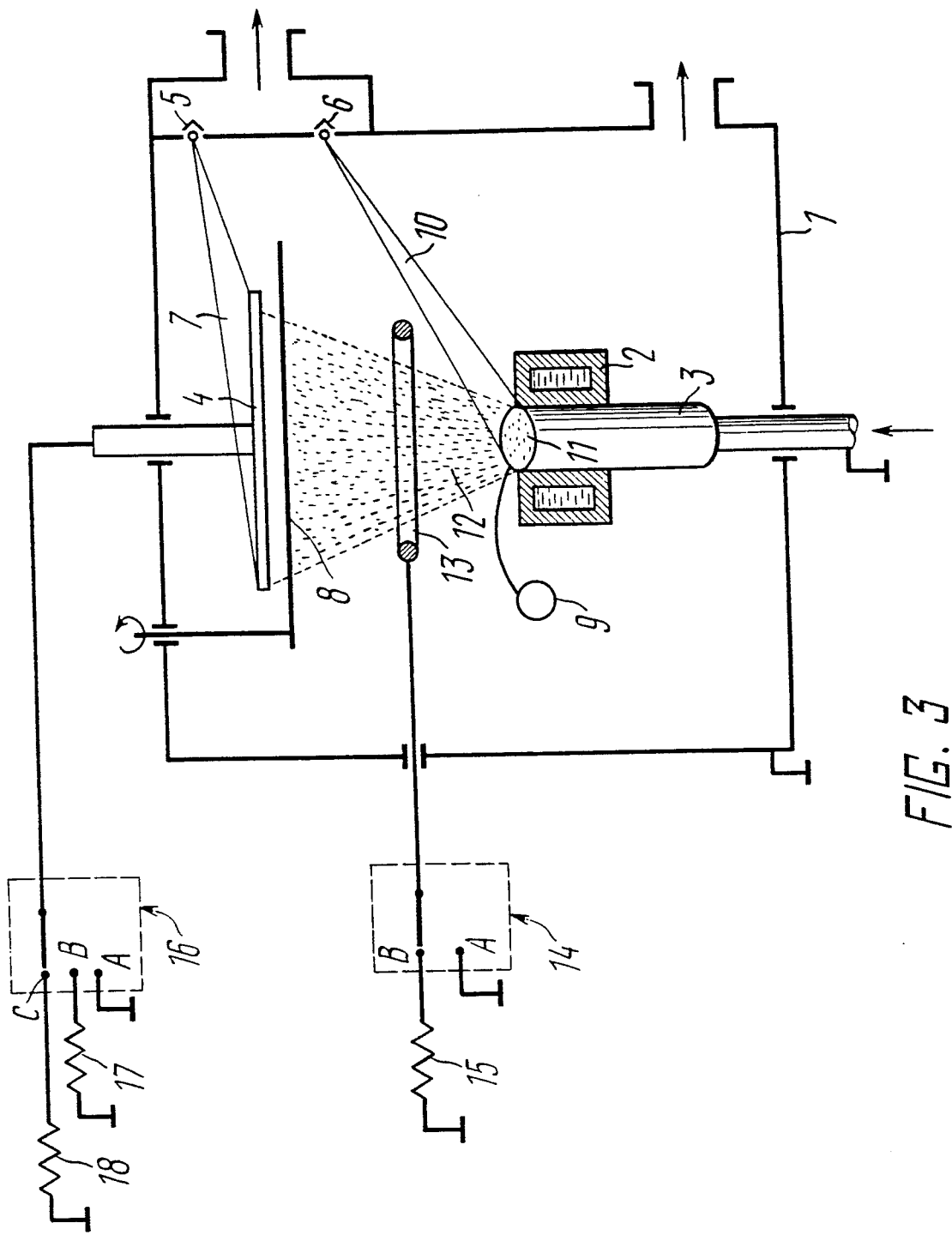
FIG. 3 shows diagrammatically an installation for electron-beam evaporation and condensation of materials with partial ionization of the vaporous flux and acceleration of the ionic component of the vapour onto a support.

An embodiment of the method of producing carbon-containing materials is possible, wherein, with a view to increasing the content of metastable phases of carbon (diamond and carbon) in the coating, a potential is fed to the support, namely, a potential which is negative with respect to the arc discharge plasma or a high-frequency potential. To do that, support 4 (FIG. 3) is isolated from chamber 1 and connected with switch 16 which allows the support 4 through matching devices (not shown in the drawing) to be connected to constant voltage source 17 or to high-frequency voltage source 18. The switch 16 provides a possibility to ground the support 4, when necessary.

In such an installation the method is carried into effect in the following manner.

In chamber 1 (FIG. 3) vacuum is created. Both switches 14 and 16 are brought to position "A". Support 4 is either heated by electron beam 7 of gun 5 to a preset temperature or cooled, for example, with water. A transition metal or a mixture of transition metals disposed on the surface of rod 3 is heated by electron beam 10 of gun 6 till melt 11 is formed, evaporation of the rod 3 being thus effected. After that the switch 14 is brought over to position "B", and a positive potential from source 15 is fed to anode 13. As a result, an arc discharge is ignited between the anode 13 and the melt 11 in vaporous flux 12 of carbon. Then the switch is brought over to position "B" or "C" and a potential negative with respect to the arc discharge plasma or a high-frequency potential is fed from the sources 17 and 18 respectively. After that damper 8 is opened and partially ionized vaporous flux 12 of carbon is condensed on the support 4. The ionic component of the vaporous flux 12 is additionally accelerated by the potential of the support 4 and acquires additional energy released during the condensation. Variation of the energy of the particles by varying the potential of the support 4 provides a possibility for varying the structure of the coating within a wide range, in particular, for producing coatings featuring an enhanced content of metastable phases of carbon: diamond and carbon.

Specific embodiments of such a method will now be considered.

EXAMPLE 5

The conditions of carrying the method into effect, and the sequence of technological operations are similar to those described in Example 4, except that in the beginning of the process switch 16 was set to position "A", and after the ignition of the arc discharge and before the opening of damper 8 the switch 16 was brought over to position "B", thus a constant negative potential with respect to the arc discharge plasma being fed from source 17 to support 4.

The condensation area of the copper water-cooled support 4 was 0.04 m². The beam current of electron gun 6 was 2.2 A, the arc discharge current was 240-280 A, the voltage drop across the arc was 30-35 V, the ionic current to the support 4 was 4.8 A, the potential of the support was 800 V, the temperature of the condensation surface of the support 4 was varied during the process of coating application within 180°-210° C. The duration of the process since the moment of the opening of the damper 8 was 5 min. The rate of coating application was 400-440 μm/h.

An x-ray structural analysis showed that the coating was an x-ray amorphous material. An analysis of the density of the electronic states in the valence zone of the coating showed that up to 30-40% of metastable phases of carbon was present in the coating, and carbon being approximately the same.

EXAMPLE 6

The conditions of carrying the method into effect and the sequence of technological operations were similar to those described in Example 4, except that in the beginning of the process switch 16 was set to position "A" and after the ignition of the arc discharge and prior to the opening of damper 8 the switch 16 was brought over to position "C", a high-frequency potential being thus fed from source 17 to support 4.

The condensation area of the copper water-cooled support 4 was 0.04 m². The beam current of electron gun 6 was 2.2 A, the arc discharge current was 260-300 A, the voltage drop across the arc was 30-35 V, the voltage frequency on the support 4 was 13.56 MHz, the amplitude value of the voltage on the support 4 was 100 V, the current in the circuit of the support 4 was 6.7 A, the temperature of the condensation surface of the support 4 in the process of coating application was 180°-220° C. The duration of the coating application process since the moment of the opening of the damper 8 was 10 min. The rate of coating application was 400-440 μm/h.

An x-ray structural analysis showed the coating to be an x-ray amorphous material. An analysis of the density of the electronic states in the valence zone of the coating showed that up to 50% of metastable phases of carbon with predominance of the diamond phase was present in the coating.

Figure 4:
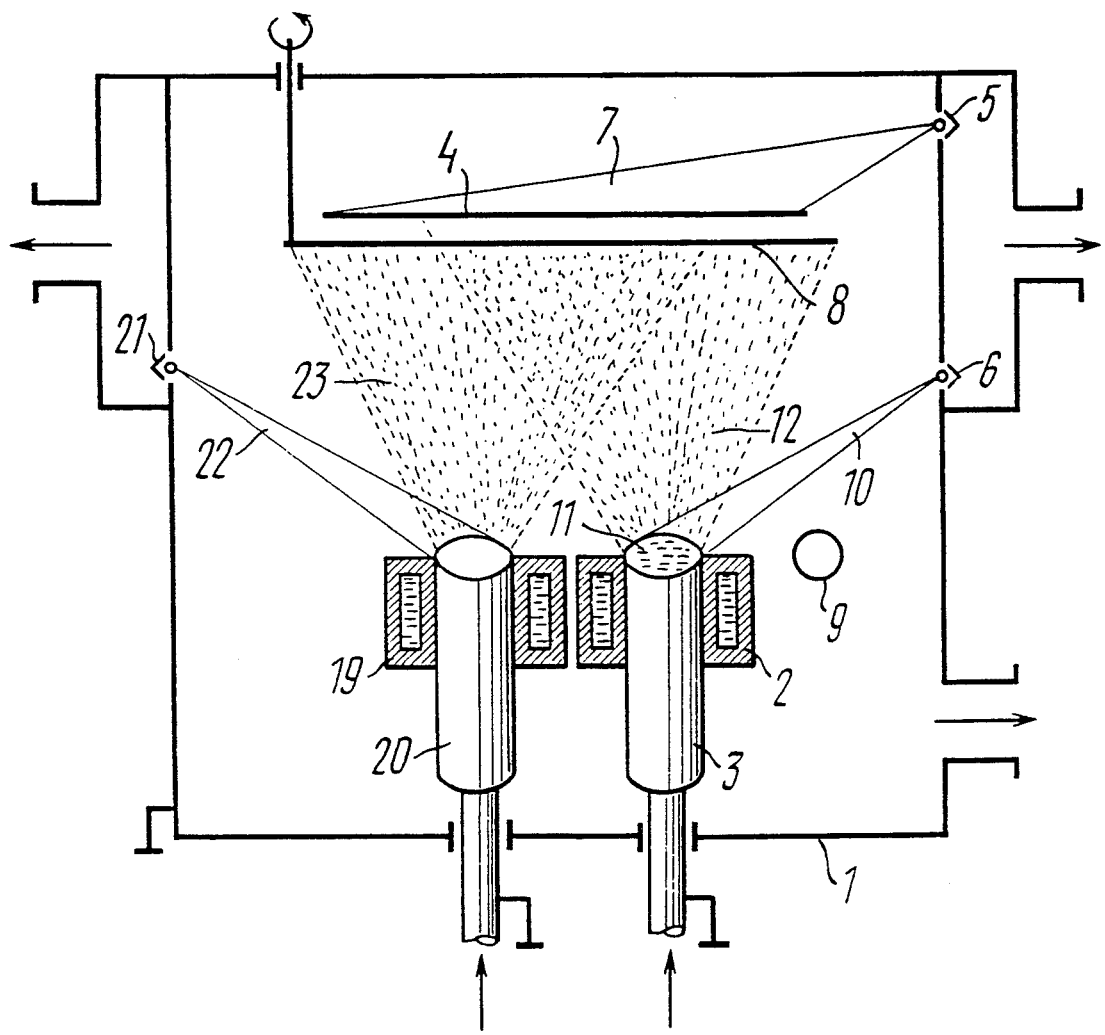
FIG. 4 shows diagrammatically an installation for electron-beam evaporation and condensation of multicomponent materials.

An embodiment of the method of producing carbon-containing materials is possible, in which, with a view to producing multicomponent carbon-containing materials, concurrently with the electron-beam evaporation of graphite, evaporation of other substances is carried out and a combined condensation of all the components of the vaporous flux onto a common support 4 is effected. To do that, in the installation for the electron-beam evaporation and condensation (FIG. 1) one more cooled crucible 19 is installed additionally (FIG. 4) and a rod 20 is arranged in it, this rod 20 consisting of a substance evaporated simultaneously with the evaporation of graphite from the crucible 2. For heating the rod 20, an electron-beam gun 21 is installed additionally. Those skilled in the art will easily understand that the number of the crucibles installed in the chamber and the number of the electron guns for heating the rods arranged in the crucibles should be chosen in accordance with the specific requirements to the coating produced on the support 4 and that this number may be greater than two.

In such an installation the method of producing carbon-containing materials is carried into effect in the following manner. In chamber 1 vacuum is created, support 4, if required, is heated by electron beam 7 of gun 5 to a preset temperature. A transition metal or a mixture of transition metals, disposed on the surface of rod 3, is heated by electron beam 10 of gun 6 till melt 11 is formed, evaporation of the graphite rod 3 being thus effected. Then the surface of rod 20 is heated by beam 22 of gun 21, evaporation of the rod 20 with the formation of vaporous flux 23 being thus carried out. Damper 8 is opened, and vaporous fluxes 12 and 23 are condensed jointly onto common support 4. In the process of condensation on the support 4 there occurs formation of a coating having a required composition and structure.

A specific embodiment of the method will now be considered.

EXAMPLE 7

Into a cylindrical water-cooled copper crucible 2 (FIG. 4) with an internal diameter of 70 mm a graphite rod 3 was placed, having a diameter of 68.5 mm and a height of 200 mm. Onto the surface of the graphite rod 3 350 g of tungsten (W) were placed. Into a cylindrical copper water-cooled crucible 19 with an internal diameter of 70 mm a titanium rod 20 was placed, having a diameter of 68.5 mm and a height of 200 mm. The distance between the axes of the crucibles 2 and 19 was 125 mm. In a chamber 1 a vacuum of $1.33-2.66 \cdot 10^{-2}$ Pa was created. A support 4 from carbon steel was heated by beam 7 of a gun 5 to the temperature of 700° C. The tungsten disposed on the rod 3 was melted by beam 10 of a gun 6; the upper end face of the titanium rod 20 was melted by beam 22 of a gun 21. Damper 8 was opened and condensation of vaporous fluxes 12 and 23 onto the support 4 was effected. The distance from the support 4 to the surface of a melt 11 and to the surface of the titanium rod was 300 mm. The current of the beam 10 was 3.0 A. The current of the beam 22 was 1.3 A. The accelerating voltage of all the guns was 20 kV. As the evaporation proceeded, the rods 3, 20 were moved upwards with a required rate and the melt 11 was replenished with tungsten wire of 0.5 mm in diameter at the rate of 0.4 mm/s from a replenishing device 9. The duration of the process since the moment of the opening of the damper 8 was 30 min. The thickness of the resulting coating was 800-850 μm. The rate of producing the coating was 1600-1700 μm/h.

An x-ray structural analysis showed the presence of titanium carbide and excess carbon in the coating. The presence of free titanium was not detected.

Figure 5:
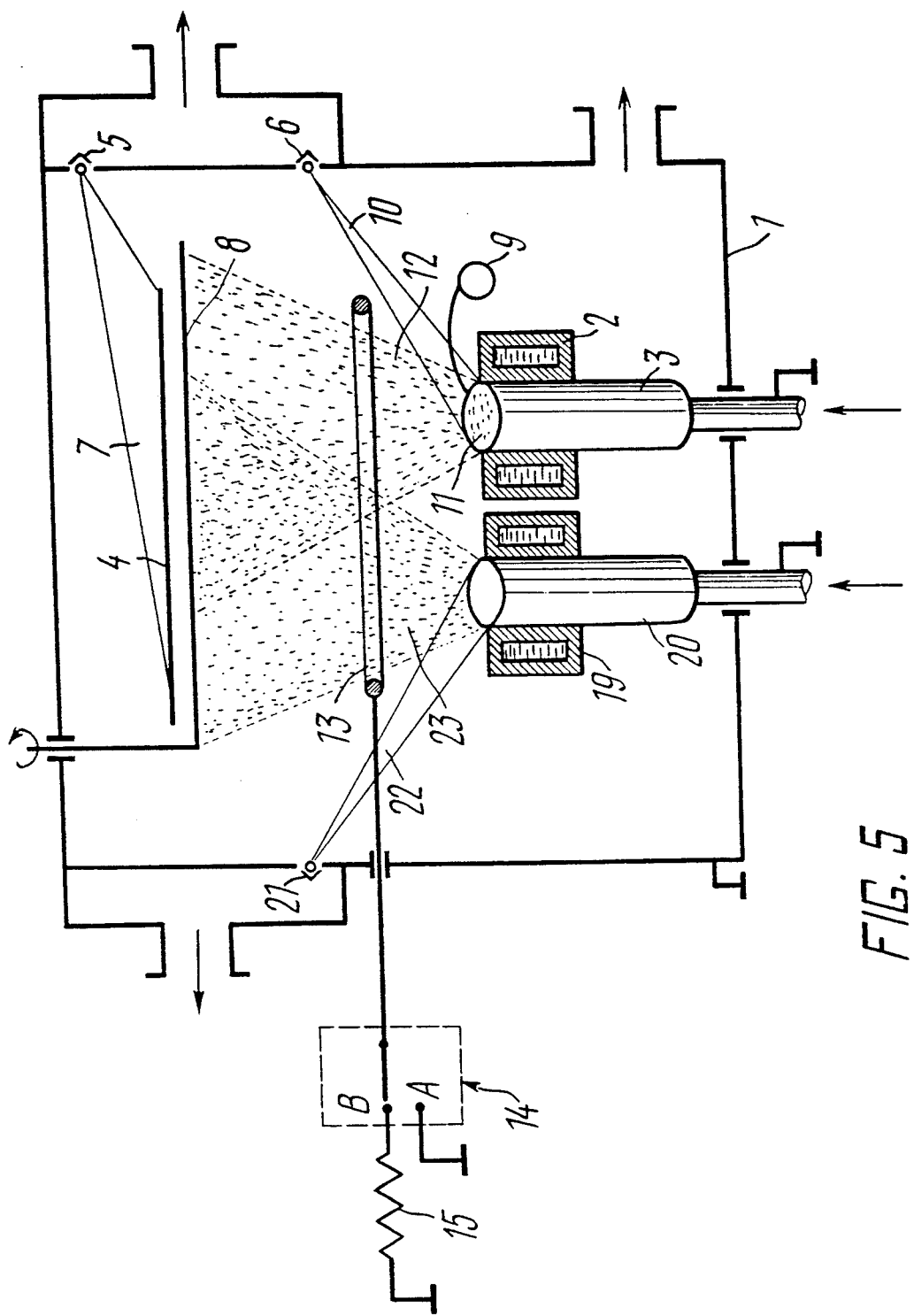
FIG. 5 shows diagrammatically an installation for electron-beam evaporation and condensation of multicomponent materials with partial ionization of the vaporous flux.

An embodiment of the method of producing carbon-containing materials is possible, wherein, with a view to reducing the condensation temperature, necessary for the synthesis of the required structure of the multicomponent coating, partial ionization of the vaporous flux is effected. To do that, the installation for the electron-beam evaporation and condensation of multicomponent materials (FIG. 4) is provided with an anode 13 (FIG. 5) disposed in the space between the damper 8 and the crucibles 2 and 19. The anode 13 through the switch 14 may be connected to the direct-current source 15 or grounded.

In the given installation the method of producing carbon-containing materials is carried into effect in the following manner. In a chamber 1 (FIG. 5) vacuum is created, a switch 14 is set to position "A", a support 4, if required, is heated by electron beam 7 of a gun 5 to a preset temperature. A transition metal or a mixture of transition metals, disposed on the surface of a rod 3, is heated by electron beam 10 of a gun 6 till a melt 11 is formed, evaporation of the rod 3 being thus effected. Then the surface of a rod 20 is heated by beam 22 of a gun 21, evaporation of the rod 20 being thus effected.

After that the switch is brought over to position "B" and a positive potential from a source 15 to an anode 13 is fed. An arc discharge is ignited in vaporous fluxes 23 and 12. After that a damper 8 is opened and the partially ionized fluxes of both components are condensed onto the support 4. The ionized component of the vaporous flux has a higher energy, which brings about a higher probability of occurrence of the chemical reaction both in the vaporous phase upon collision of the particles of different components and on the support due to the release of excess energy of condensation, which provides a possibility for reducing the temperature of the support 4, necessary for the synthesis of the coating having a required structure.

A specific embodiment of the method will now be considered.

EXAMPLE 8

The conditions of carrying the method into effect and the sequence of technological operations are similar to those described in Example 7, except that before carrying out the process the switch 14 was brought over to position "A", the support 4 was heated by the electron beam to the temperature of 450° C., and after the tungsten and titanium were melted the switch 14 was brought over to position "B", a positive potential being thus fed from the source 15 to the anode 13. After that the damper 8 was opened and the process of condensation commenced.

The current of the beam 10 was 3.0 A, the current of the beam 22 was 1.3 A, the arc discharge current was 360–400 A, the voltage drop across the arc was 25–30 V. The duration of the process of coating application since the moment of the opening of the damper 8 was 30 min. The thickness of the coating was 850–880 $\mu$m. The rate of coating application was 1700–1760 $\mu$m/h.

An x-ray structural analysis of the coating showed the presence of titanium carbide and excess carbon in it. No free titanium was detected. The cited data indicate that synthesis of titanium carbide occurred at the condensation temperature of 450° C.

An embodiment of the method of producing carbon-containing materials is possible, wherein, with a view to further reduction of the condensation temperature necessary for the synthesis of the multicomponent coating of a required structure, a potential negative to the arc discharge plasma or a high-frequency potential is fed to the support. To do that, the support 4 is isolated from the chamber 1 and is connected with the switch 16 which allows the support 4 to be connected through matching devices (not shown in the drawing) to a source 17 of a direct current or high-frequency voltage. The switch makes it possible to ground the support 4, when necessary.

Figure 6:
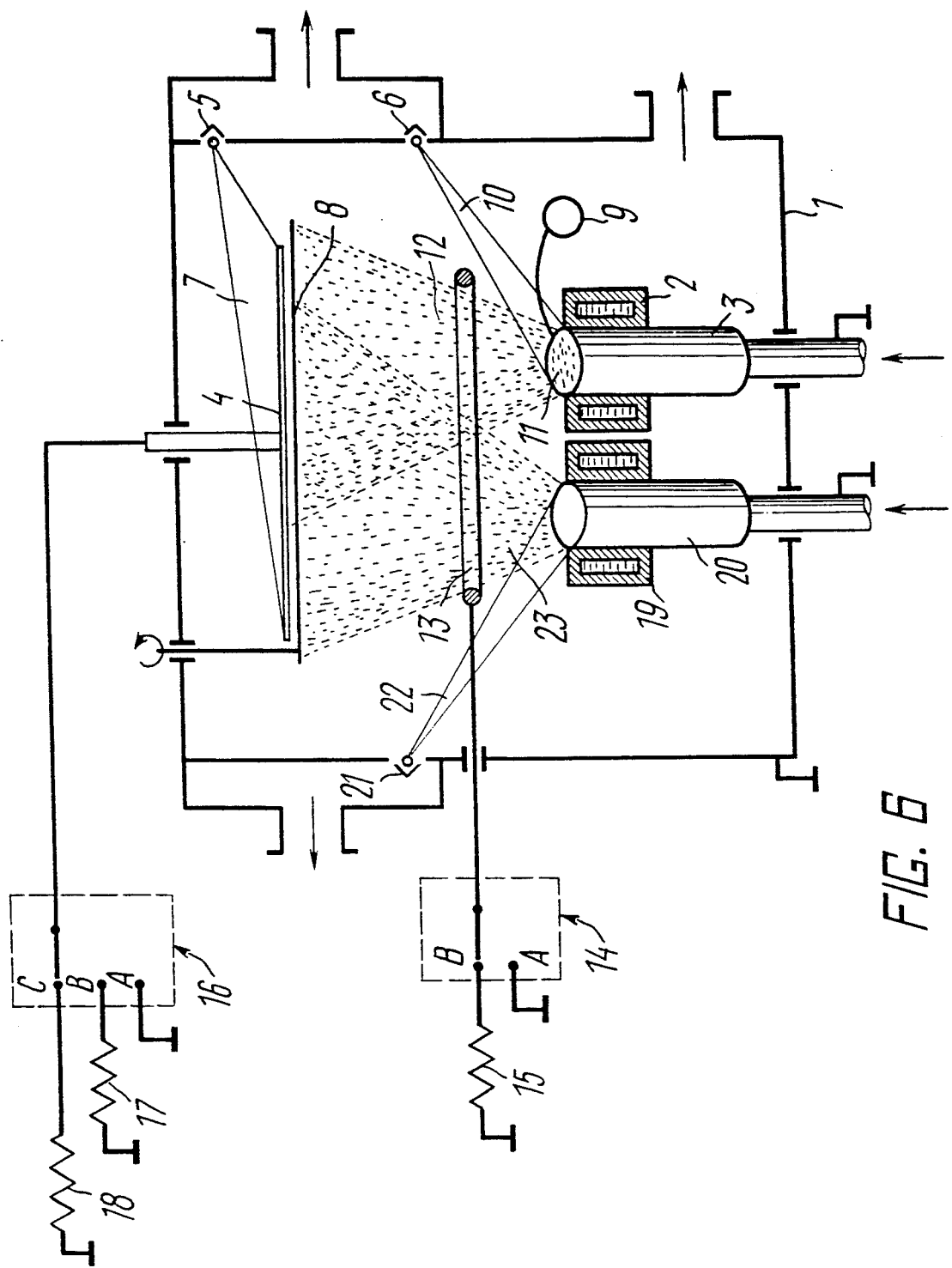
FIG. 6 shows diagrammatically an installation for electron-beam evaporation and condensation of multicomponent materials with partial ionization of the vaporous flux and acceleration of the ionic component of the vapour onto a support.

In such an installation the method of producing carbon-containing materials is carried into effect in the following manner. Both switches 14 and 16 are brought over to position "A", after creating vacuum in a chamber 1 (FIG. 6). A support 4 is either heated by electron beam 7 of a gun 5 to a required temperature or cooled, for example, with water. A transition metal or an alloy of transition metals, disposed on a graphite rod 3, is heated by electron beam 10 of a gun 6 till a melt 11 is formed, evaporation of the rod 3 being thus effected; by beam 22 of a gun 21 the end surface of a rod is heated, evaporation thereof being thus effected. After that the switch 14 is brought over to position "B" and a positive potential is fed from a source 15 to an anode 13. As a result, an arc discharge arises in vaporous fluxes 12 and 23. Then the switch is brought over to position "B" or "C" and a potential, negative with respect to the arc discharge plasma, or a high-frequency potential is fed to the support 4 from sources 17 and 18 respectively. After that a damper 8 is opened and the partially ionized fluxes of both components are condensed onto the support 4. The ionic component of the vaporous fluxes is additionally accelerated by the potential of the support and acquires an additional energy released during the condensation. Variation of the energy of the particles by varying the potential of the support 4 provides a possibility for varying the structure of the coating within a wide range, in particular, it becomes possible to reduce the temperature of the support 4, necessary for the synthesis of the coating having a required structure.

Now specific embodiments of the method will be considered.

EXAMPLE 9

The conditions of carrying the method into effect and the sequence of technological operations are similar to those described in Example 8, except that in the beginning of the process the switch 16 was brought over to position "A" and after the ignition of the arc discharge and prior to the opening of the damper 8 the switch 16 was brought over to position "B", a constant negative potential with respect to the arc discharge plasma being thus fed from the source 17 to the support 4.

The condensation area of the copper water-cooled support 4 was 0.04 m$^2$. The current of the beam 10 was 3.0 A, the current of the beam 22 was 1.3 A, the arc discharge current was 380 to 420 A, the voltage drop across the arc was 22–30 V, the ionic current to the support was 7.2 A, the potential of the support was $-1000$ V, the temperature of the condensation surface of the support in the process of applying the coating was varied within 230°–250° C. The duration of the process of coating application since the moment of the opening of the damper 8 was 30 minutes. The coating thickness was 850–880 $\mu$m. The rate of coating application was 1700–1760 $\mu$m/h.

An x-ray structural analysis of the coating showed the presence of titanium carbide and excess carbon in it. No free titanium was detected. The cited data indicate that synthesis of titanium carbide occurred at the condensation temperature of 230°–250° C.

EXAMPLE 10

The conditions of carrying the method into effect and the sequence of technological operations are similar to those described in Example 9, except that in the crucible 19 there was disposed not a titanium rod, but a rod 20 made of silicon, having a diameter of 68 mm and a height of 200 mm; furthermore, after the ignition of the arc discharge and prior to the opening of the damper 8 the switch 16 was brought over not to position "B" but to position "C", a high-frequency potential being thus fed from the source 18 to the support 4.

The condensation area of the copper water-cooled support was 0.04 m². The current of the beam 10 was 2.5 A, the current of the beam 22 was 1.2 A, the arc discharge current was 240 to 270 A, the voltage drop across the arc was 30–35 V. The current in the circuit of the support was 5.5 A, the frequency of the voltage at the support was 13.56 MHz, the amplitude value of the voltage at the support was 140 V, the temperature of the condensation surface in the process of coating application was 200°–230° C. The duration of the process of coating application since the moment of the opening of the damper 8 was 30 minutes. The thickness of the coating was 390–410 μm. The rate of coating application was 780–820 μm/h.

An x-ray structural analysis of the coating showed the presence of silicon carbide, excess carbon, and an insignificant quantity of free silicon therein. The cited data indicate that synthesis of silicon carbide occurred at the condensation temperature of 200°–230° C.

When it is necessary to produce materials whose structure and composition are similar to those of the coatings produced in Examples 1–10, the coatings are separated from the support by any conventional method and, if required, are subjected to further treatment.

Thus, the method of producing carbon-containing materials, due to modification of the conditions of carbon evaporation, provides a possibility for a considerable increase of the specific rate of carbon evaporation without the ejection of graphite fragments into the vapour phase, and, as a consequence, it provides a possibility for increasing the efficiency of the process of producing carbon-containing materials and coatings by as much as 10–100 times within a wide range of temperatures of the support, while in the case of ionization of the vaporous flux there appears a possibility of producing carbon-based materials and coatings with a high efficiency, said materials and coatings containing metastable phases of carbon: diamond and carbin. In the case of producing multicomponent coatings there arises a possibility of reducing the temperature of the support, necessary for the synthesis of the required structure of the material and coating and thus of extending the range of support materials.

Industrial Applicability

The present invention may be used in the tool-making industry for producing high-hardness and wear-resistant materials with a high thermal conduction on cutting tools, in mechanical engineering for producing wear-resistant coatings with a low coefficient of friction, in chemical engineering for producing corrosion-resistant coatings, in electronics for producing dielectric and semiconductor coatings and films with a high thermal conduction, containing diamond and carbin, in medicine for producing biologically compatible wear-resistant materials and coatings on artificial organs, in the chemical industry and biotechnology for manufacturing membranes and sorbents with controlled porosity.

What is claimed is:

1. A method of producing carbon-containing materials, comprising electron-beam vacuum evaporation of graphite with subsequent condensation thereof onto a support, comprising, prior to the electron-beam evaporation of the surface of the graphite, disposing at least one transition metal selected from Groups VI, VII and VIII of the Periodic System on the surface of the graphite, directing the electron-beam onto the transition metal and the graphite surface thereunder, thereby melting the transition metal and evaporating the graphite surface, and condensing the evaporated material onto the support.

2. A method according to claim 1, characterized in that tungsten or molybdenum is used as a transition metal of Groups VI–VIII of the Periodic System.

3. A method according to claim 1, characterized in that a mixture of tungsten and molybdenum, for example, in the atomic ratio of 1:1, is used as a mixture of at least two transition metals of Groups VI–VIII of the Periodic System.

4. A method according to claim 1, comprising carrying out partial ionization of the evaporated material in an arc discharge plasma.

5. A method according to claim 4, comprising feeding a negative potential to the support.

6. A method according to claim 4 comprising, simultaneously with the electron-beam evaporation of graphite, carrying out electron-beam evaporation of titanium or silicon and effecting a joint condensation of all evaporated components onto a common support.

* * * * *

UNITED STATES PATENT AND TRADEMARK OFFICE
CERTIFICATE OF CORRECTION

PATENT NO. : 5,296,274
DATED : March 22, 1994
INVENTOR(S) : B. MOVCHAN ET AL

It is certified that error appears in the above-indentified patent and that said Letters Patent is hereby corrected as shown below:

Column 2, line 6, change "carbin" to --carbyne--.

Column 3, line 40, change "carbon" (second occurrence) to --carbyne--.

Column 4, line 24, change "carbon" to --carbyne--;

line 44, change "carbon" (second occurrence) to --carbyne--.

Column 7, line 9, change "carbon" (second occurrence) to --carbyne--.

Column 8, line 21, change "carbon" to --carbyne--;

line 58, change "carbon" (second occurrence) to --carbyne--.

UNITED STATES PATENT AND TRADEMARK OFFICE
CERTIFICATE OF CORRECTION

PATENT NO. : 5,296,274
DATED : March 22, 1994
INVENTOR(S) : B. MOVCHAN ET AL

It is certified that error appears in the above-indentified patent and that said Letters Patent is hereby corrected as shown below:

Column 9, line 19, after "," add --the content of diamond and--;
change "carbon" (second occurrence) to --carbyne--.

Column 13, line 41, change "carbin" to --carbyne--.

Column 14, line 11, change "carbin" to --carbyne--.

Signed and Sealed this

Sixteenth Day of August, 1994

BRUCE LEHMAN

Attest:

Attesting Officer

Commissioner of Patents and Trademarks